(12) United States Patent
Chang et al.

(10) Patent No.: US 11,062,074 B2
(45) Date of Patent: Jul. 13, 2021

(54) BOUNDARY CELL

(71) Applicant: Taiwan Semiconductor Manufacturing Company, Ltd., Hsinchu (TW)

(72) Inventors: Yu-Jung Chang, Hsinchu (TW); Min-Yuan Tsai, Hsinchu (TW); Wen-Ju Yang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/577,432

(22) Filed: Sep. 20, 2019

(65) Prior Publication Data

US 2020/0364315 A1    Nov. 19, 2020

Related U.S. Application Data

(60) Provisional application No. 62/848,290, filed on May 15, 2019.

(51) Int. Cl.
*G06F 30/392* (2020.01)

(52) U.S. Cl.
CPC .................. *G06F 30/392* (2020.01)

(58) Field of Classification Search
CPC .................................................. G06F 30/392
See application file for complete search history.

(56) References Cited

U.S. PATENT DOCUMENTS

| | | | | |
|---|---|---|---|---|
| 9,898,569 | B2 * | 2/2018 | Wu | ......................... G06F 30/392 |
| 10,157,922 | B2 * | 12/2018 | Lin | .................. H01L 21/76897 |
| 2005/0044522 | A1 | 2/2005 | Maeda | |
| 2011/0272815 | A1 * | 11/2011 | Misaka | .................. G06F 30/392 |
| | | | | 257/773 |
| 2014/0325466 | A1 * | 10/2014 | Ke | ........................ H01L 21/845 |
| | | | | 716/119 |
| 2016/0300851 | A1 | 10/2016 | Kim et al. | |
| 2018/0151553 | A1 | 5/2018 | Liaw | |

FOREIGN PATENT DOCUMENTS

| | | |
|---|---|---|
| KR | 10-2016-0121770 A | 10/2016 |
| KR | 10-2018-0060988 A | 6/2018 |
| TW | 200701027 A | 1/2007 |
| TW | 1372432 B | 9/2012 |
| TW | 1636525 B | 9/2016 |

OTHER PUBLICATIONS

German Office Action for Application No. 10 2019 127 214.9 dated Feb. 3, 2021.
Taiwan Office Action for Application No. 11020352130 dated Apr. 16, 2021.

* cited by examiner

*Primary Examiner* — Nghia M Doan
(74) *Attorney, Agent, or Firm* — Merchant & Gould P.C.

(57) ABSTRACT

Boundary cells may be provided. A boundary of a first functional cell of a circuit is determined. A first plurality of a first type of dummy cells are placed along a first portion of the determined boundary. The first portion extends in a first direction. Each of the first type of dummy cells comprises first pre-defined dimensions. A second plurality of a second type of dummy cells are placed along a second portion of the determined boundary. The second portion extends in a second direction. Each of the second type of dummy cells comprises second pre-defined dimensions. The second pre-defined dimensions is different than the first pre-defined dimensions.

18 Claims, 6 Drawing Sheets

BOUNDARY CELL

PRIORITY CLAIM AND CROSS-REFERENCE

This application claims priority to U.S. Provisional Patent Application No. 62/848,290 titled "BOUNDARY CELL" filed May 15, 2019, the disclosure of which is hereby incorporated by reference in its entirety.

BACKGROUND

Integrated circuits typically include thousands of components having complex interrelationships. These circuits are generally designed using highly automated processes known as electronic design automation (EDA). EDA begins from a functional specification provided in a hardware description language (HDL) and continues through the specification of a circuit design including the specification of elementary circuit components called cells, the physical arrangement of the cells, and the wiring that interconnects the cells. The cells implement logic or other electronic functions using a particular integrated circuit technology.

EDA can be divided into a series of stages such as synthesis, placement, routing, etc. These steps can involve selecting functional cells or IP/Blocks from a library of cells. Typically, a very large number of different circuit designs using various cell combinations can meet a functional specification for a circuit. The various functional cells selected to implement the desired functions are merged in an integration flow process that arranges the cells in a floor plan.

The functional cells may have different boundary shapes, and the merge process may include many design rules and restrictions that specify how cells are arranged relative to one another, which can complicate the integration process. Such design rules, for example, may specify forbidden or empty spaces (vertical and horizontal directions) in the layout, establish spacing requirements, etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
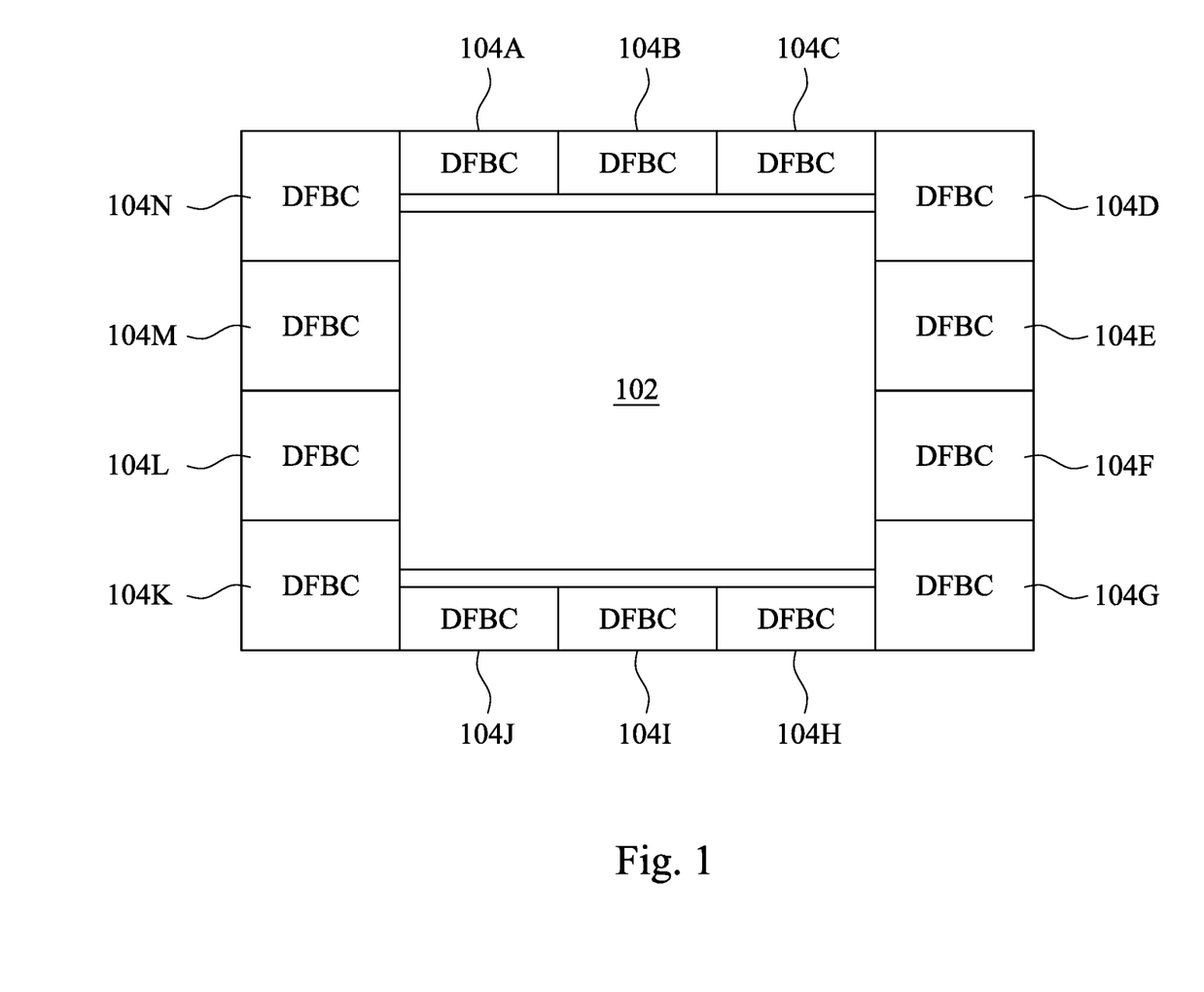
FIG. 1 is an example diagram illustrating a functional cell bounded by dummy boundary cells, in accordance with some embodiments.

FIG. 1 is a diagram illustrating a functional cell surrounded by dummy boundary cells. For example, and as shown in FIG. 1, a functional cell 102 is surrounded by a plurality of dummy boundary cells 104, for example, a first dummy boundary cell 104A, a second dummy boundary cell 104B, a third dummy boundary cell 104C, a fourth dummy boundary cell 104D, a fifth dummy boundary cell 104E, a sixth dummy boundary cell 104F, a seventh dummy boundary cell 104G, an eighth dummy boundary cell 104H, a ninth dummy boundary cell 104I, a tenth dummy boundary cell 104J, an eleventh dummy boundary cell 104K, a twelfth dummy boundary cell 104L, a thirteenth dummy boundary cell 104M, and a fourteenth dummy boundary cell 104N.

Plurality of dummy boundary cells 104 extend around functional cell 102 thereby forming a ring around functional cell 102. Although functional cell 102 is shown to be surrounded by fourteen dummy boundary cells 104A-104N, it will be apparent to a person with ordinary skill in the art after reading this disclosure that the number of dummy boundary cells is not limited to fourteen and may vary based on the dimensions of functional cell 102.

Functional cell 102 can be a standard cell and may include an entire device, such as a transistor, diode, capacitor, resistor, or inductor, or can include a group of several devices arranged to achieve some particular function, such as an inverter, a flip-flop, a memory cell, or an amplifier, among others. In addition to making functional design easier to conceptualize, the use of functional cell 102 can reduce verification time for design rule checking (DRC) of the layout features within the IC, because functional cell 102 that is repeated throughout the layout can be checked a single time in DRC rather than each instantiation being checked individually. In example embodiments, functional cell 102 can include a reusable unit of logic, cell, or integrated circuit layout design that may be proprietary to an entity. Such functional cell 102 can be used as building blocks within Application Specific Integrated Circuit (ASIC) designs or Field Programmable Gate Array (FPGA) designs.

Plurality of dummy boundary cells 104 are sometimes referred to herein as "Dummy-Friendly Boundary Cells"

Figure 2A:
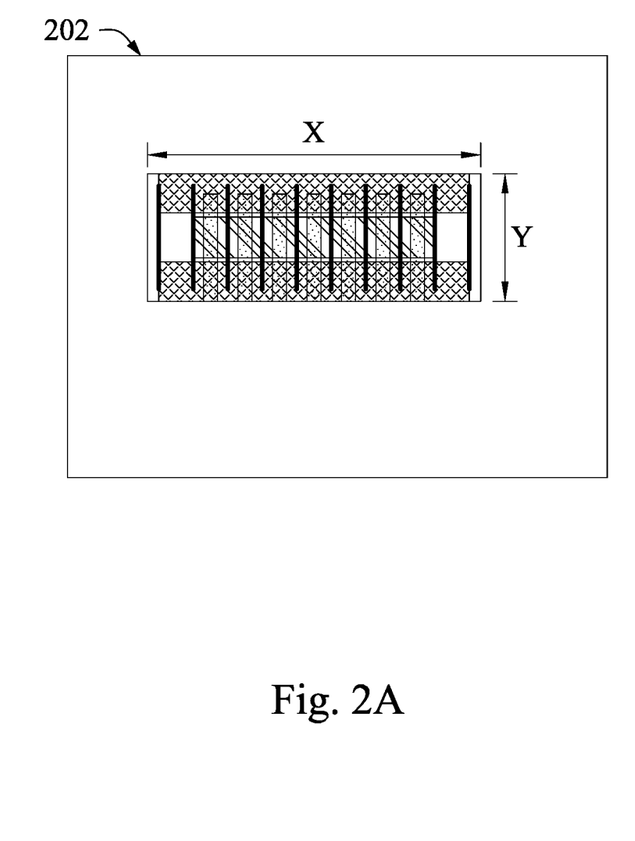
FIGS. 2A and 2B illustrate examples of pre-determined structures for dummy boundary cells, in accordance with some embodiments.
Figure 2B:
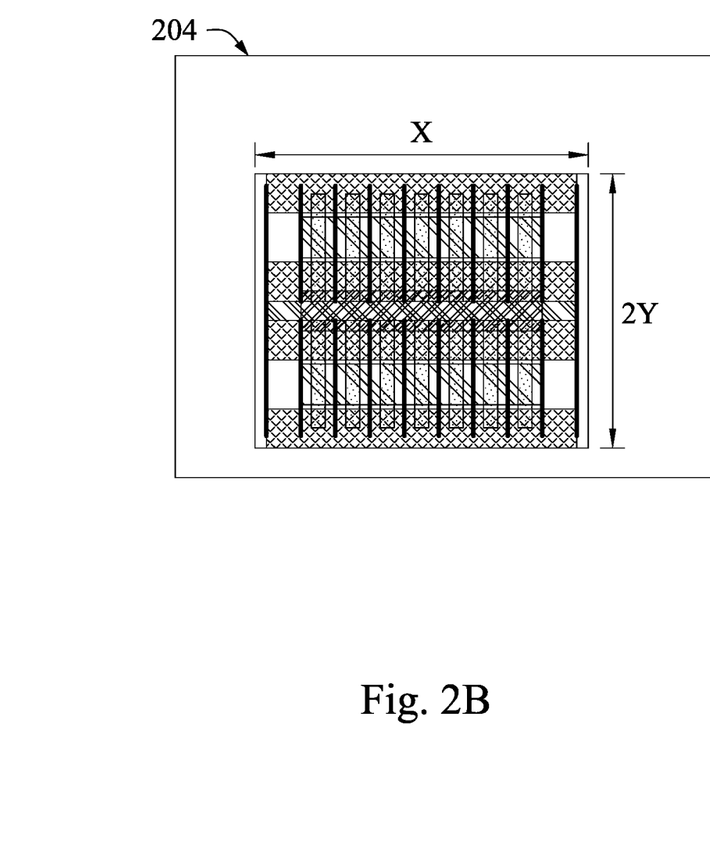

(DFBC). The term "dummy" is used because the DFBCs are not utilized in the functionality of functional cell 102 or a chip containing functional cell 102. Plurality of dummy boundary cells 104 may have one or more predetermined structures (also referred to as standard dummy cells) to facilitate application around functional cell 102. FIGS. 2A and 2B illustrates examples of such pre-determined structures for plurality of dummy boundary cells 104. For instance, and as shown in FIGS. 2A and 2B, in certain implementations a first DFBC structure (DFBC1) 202 may have predetermined height (y) and length (x) dimensions, while a second DFBC structure (DFBC2) 204 may have the same length (x) dimension and a height dimension twice that of the first DFBC (2y).

Although only two pre-determined structures are shown in FIGS. 2A and 2B for plurality of dummy boundary cells 104, it will be apparent to a person skill in the art after reading this disclosure that more than two pre-determined structures may be defined. Moreover, it will be apparent to a person skill in the art after reading this disclosure that the pre-determined structures are not limited to rectangular or cubicle shape and can include other shapes.

In example embodiments, the pre-determined structures of plurality of dummy boundary cells 104 (i.e., the structures of DFBC1 202 and DFBC2 204) may be pre-defined in a standard library. The standard cell library is a database that stores definitions of standard dummy cells, for example, DFBC1 202 and DFBC2 204. The standard dummy cells may be utilized by computer aided design (CAD) tools (e.g., electronic design automation (EDA) tools) to facilitate forming of IC layouts. DFBC1 202 and DFBC2 204 can be defined using a set of characteristics. By way of non-limiting example, the characteristics can include a size/shape of each partition among others.

Figure 3A:
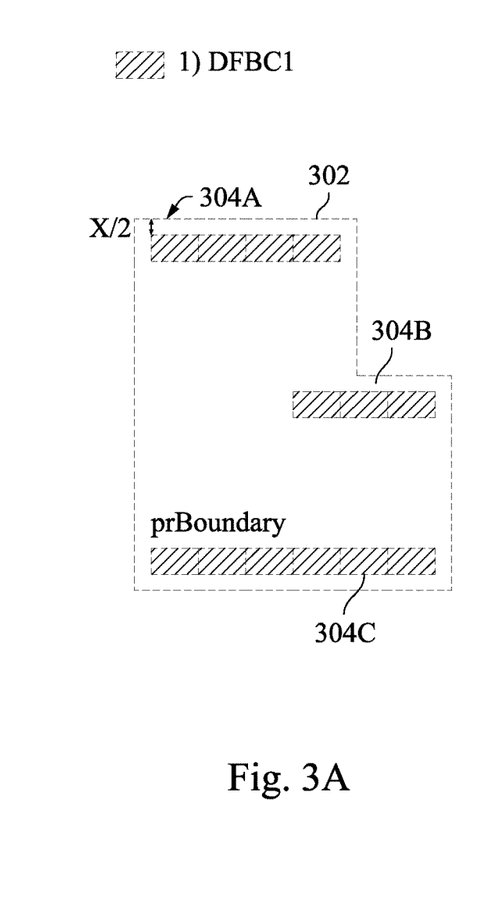
FIGS. 3A, 3B, and 3C illustrate a fill sequence for placement of dummy boundary cells around a functional cell, in accordance with some embodiments.
Figure 3B:
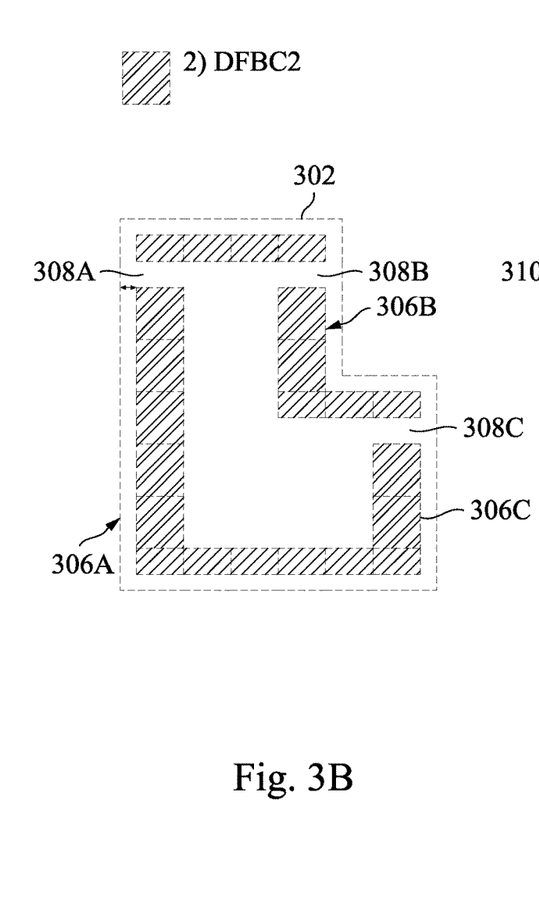
Figure 3C:
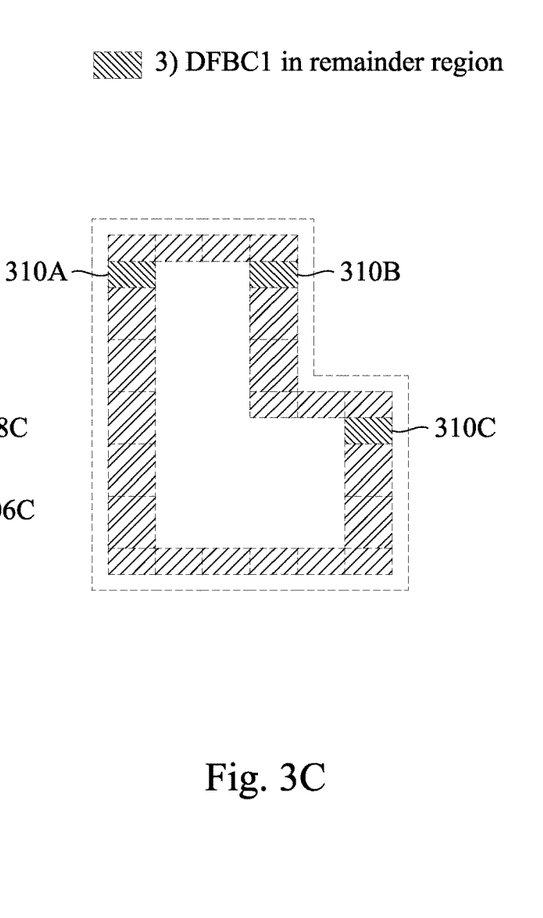

A ring which includes plurality of dummy boundary cells 104 is created around functional cell 102 by placing a plurality of standard dummy cells (i.e., DFBC1 202 and DFBC2 204) around functional cell 102. FIGS. 3A, 3B, and 3C illustrates a fill sequence for the placement of DFBC1 202 and DFBC2. The fill sequence begins with placing a first plurality of DFCB1 202 in a first direction. For example, and as shown in FIG. 3A, a first plurality of DFCB1 202 are placed along portions of a boundary 302 extending in a horizontal direction (illustrated as 304A, 304B, and 304C). The first plurality of DFBC1 202 are placed one after other forming a continuous chain which extends in the horizontal direction and covers each portions of boundary 302 that extend in the horizontal direction. The first plurality of DFBC1 202 are placed inside and at a distance comprising half a value of a design rule check (DRC) value (i.e., y/2) from a prBoundary 302. Boundary 302 may be a place and route (PR) boundary which may represent a region within which placement of circuit elements is done and where routing is constrained for a standard cell.

After placement of the first plurality of DFBC1 202 in the first direction, the fill sequence proceeds to placing a second plurality of DFBC 204 in a second direction. For example, and as shown in FIG. 3B, the second plurality of DFBC2 204 are placed along portions of boundary 302 that extend in a vertical direction (illustrated as 306A, 306B and 306C). The second plurality of DFBC2 204 are placed abutting one after other thus forming a continuous chain which extends in the horizontal direction and covers each portions of boundary 302 that extend in the horizontal direction. Each of the second plurality of DFBC2 202 are also placed at a distance comprising half a value of the DRC value (i.e., y/2) from boundary 302.

Continuing to FIG. 3C, any gaps (designated as 308A, 308B and 308C) around boundary 302 after placement of the first plurality of DFBC1 202 and the second plurality of DFBC2 204 are then filled with additional DFBC1 202 (designated as 310A, 310B, and 310C). For example, the additional DFBC1 202 are placed in gaps 308A, 308B and 308C thereby forming a continuous chain or ring of plurality of DFBC1 202 and DFBC2 204. The additional DFBC1 202 are also placed at a distance comprising half a value of the DRC value from the boundary (y/2).

In example embodiments, each of DCBC1 202 and DFBC2 204 can abut with another DFBC1 202 and DFBC2 204 in any of the x-direction or y-direction. In addition, DFBC1 202 and DFBC2 204 undergo vertical expansion by multiplying heights of DFBC1 202 and DFBC2 204 respectively. Multiplication of the height may include placing DFBC1 202 or DFBC2 204 cell on top of another DFBC1 202 or DFBC2 204. In this manner, the dummy boundary cells may be used for a wide variety of functional cell shapes, including rectangle, U-shape, L-shape, Z-shape, cross-shape, etc. In some aspects, the dummy boundary cells DFBC1 202 and DFBC2 204 are combined as needed to surround the periphery of the functional cells.

Figure 4A:
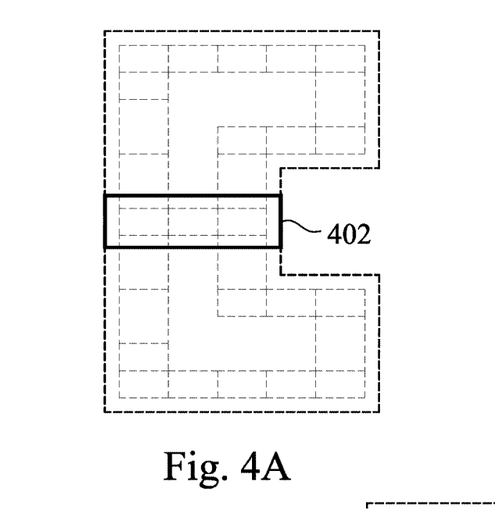
FIGS. 4A, 4B, 4C, and 4D illustrate sharing of dummy boundary cells by adjacent functional cells, in accordance with some embodiments.
Figure 4B:
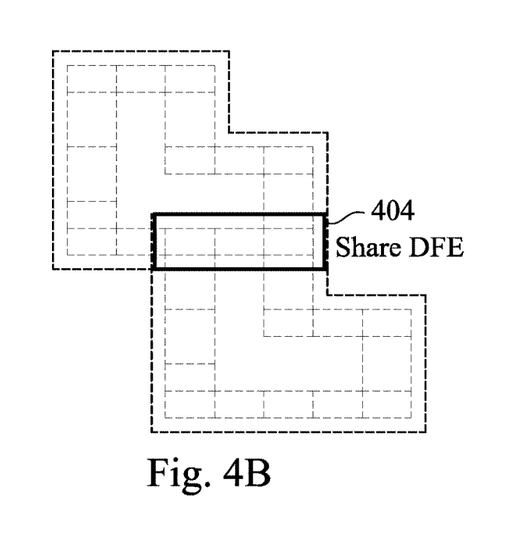
Figure 4C:
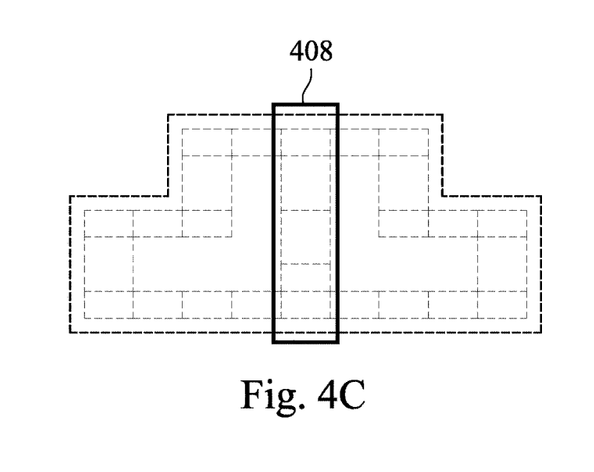
Figure 4D:
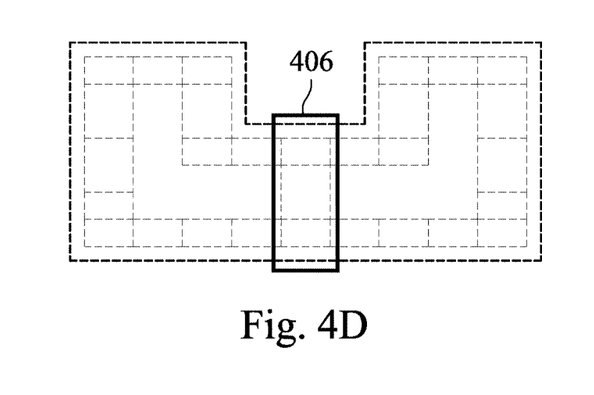

In some examples, portions of dummy boundary cells 104 may be "shared" between adjacent functional cells. This could result in reduced chip size and a more efficient use of space in a floor plan. In some embodiments, only the same type of dummy boundary cells 104 are overlapped in this manner. For instance, DFBC1 202 could be shared between adjacent functional cells and DFBC2 204 could be shared between adjacent functional cells. FIGS. 4A, 4B, 4C, and 4D illustrates sharing of DFBC1 202 and DFBC2 204. For example, FIGS. 4A and 4B illustrates sharing of DFBC1 202 between two cell boundaries (illustrated as 402 and 404). FIGS. 4C and 4D, on the other hand, illustrates sharing of both DFBC1 202 and DFBC 204 between two cell boundaries (illustrated as 406 and 408). Although not shown, DFBC2 204 may also be shared between two cell boundaries. However, in such examples, DFBC1 202 cell may not be allowed to overlap with DFBC2 204 and be shared between adjacent functional cells.

Figure 5:
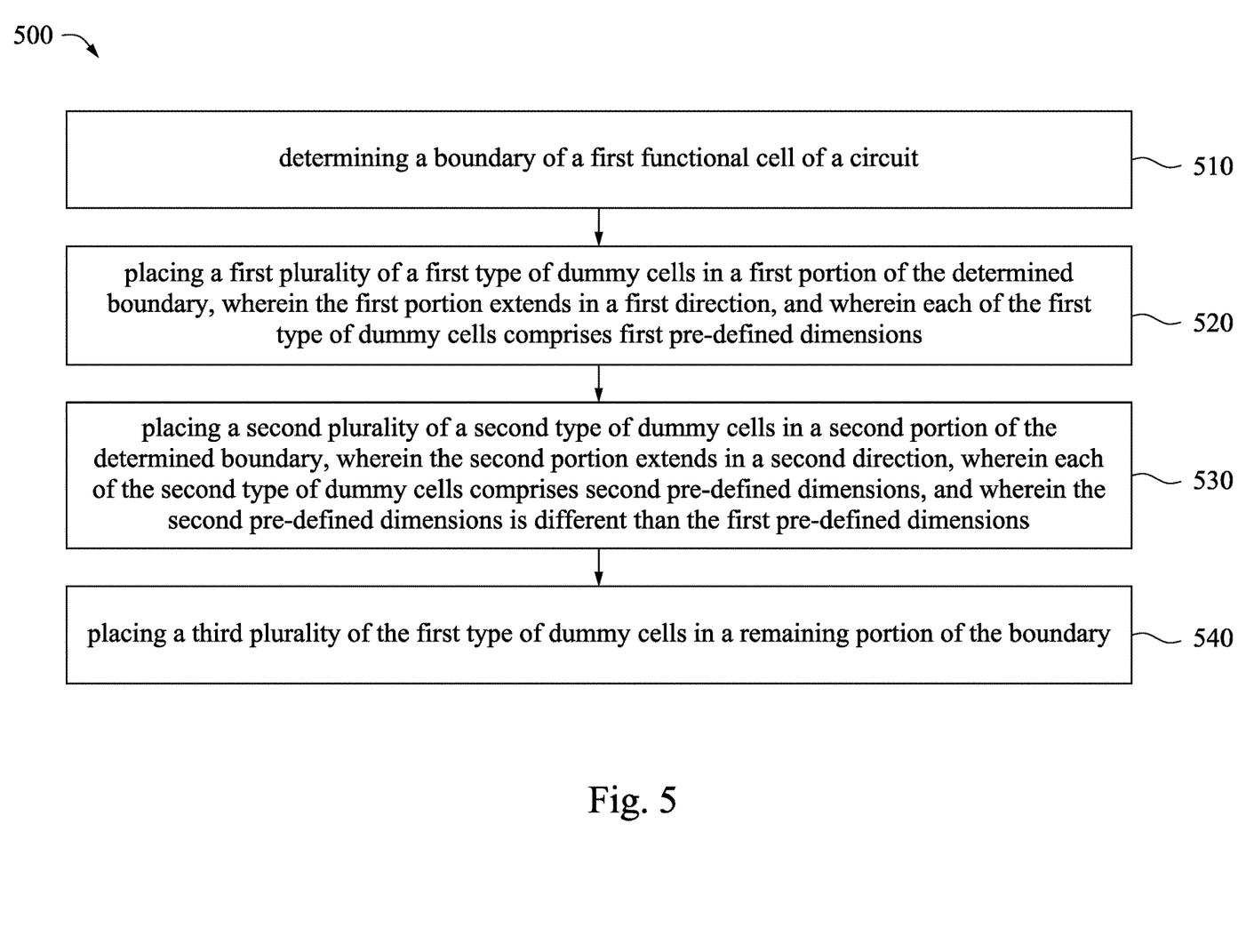
FIG. 5 illustrates a method for placement of dummy boundary cells around a functional cell, in accordance with some embodiments.

FIG. 5 illustrates a method 500 for placement of dummy boundary cells 104 around functional cell 102. Method 500 may be implemented by a processing device 600 as described in more detail below with respect to FIG. 6. Ways to implement the stages of method 500 will be described in greater detail below.

Figure 6:
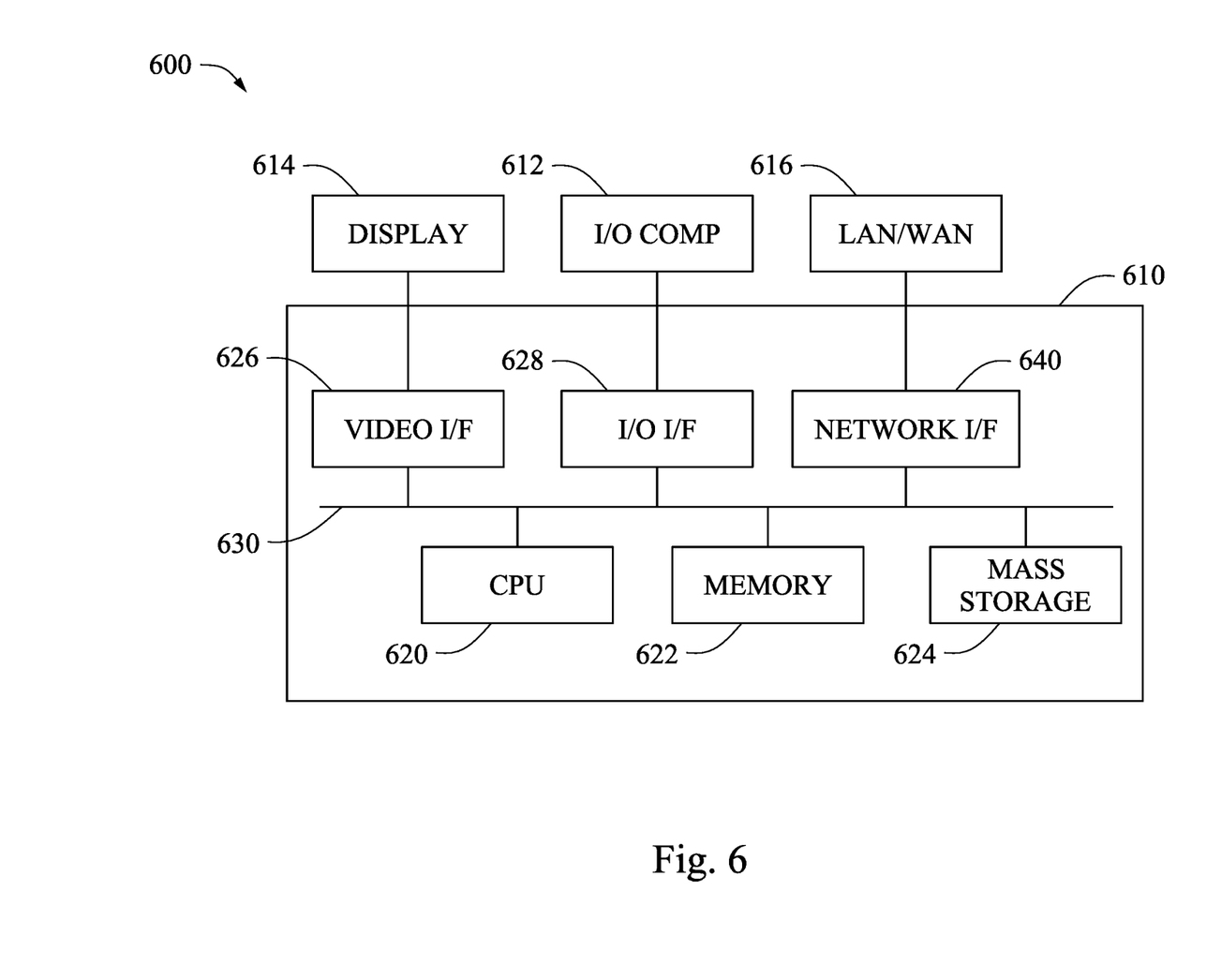
FIG. 6 is a block diagram illustrating an example of a processing system in accordance with some embodiments.

Referring to FIG. 6 along with FIGS. 3A-C, starting at operation 510, a boundary of a first functional cell of a circuit is determined. For example, a boundary 302 of functional cell 102 is determined. The determined boundary 302 can be a PR boundary of functional cell 102. In example embodiments, boundary 302 is determined from a layout of functional cell 102, a layout of a circuit or a layout of a chip which includes functional cell 102.

Moving to operation 520, a first plurality of a first type of dummy cells are placed along a first portion of the determined boundary. For example, a first plurality of DFBC1 202 are placed along a horizontal portions of the boundary 302. A first plurality of DFBC1 202 are placed inside boundary 302 at a predetermined distance from boundary 302. The first plurality of DFBC1 202 are placed abutting each other and form a chain which extends in the first direction that covers the portions of boundary 302 that extend in the horizontal direction. Each of the first plurality of DFBC1 202 include a first pre-defined dimensions. For example, the first pre-determined dimensions may have predetermined height (y) and length (x) dimensions. The first plurality of first type of cell are placed at a distance comprising half a value of the DRC value from boundary 302 (that is, y/2).

Proceeding to operation 530, a second plurality of a second type of dummy cells are placed along a second portion of the determined boundary. For example, a second plurality of DFBC2 204 are placed along vertical portions of boundary 302. A second plurality of DFBC2 204 are placed inside boundary 302 at a predetermined distance from boundary 302. The second plurality of DFBC2 204 are placed abutting each other and form a chain which extends in the second direction and covers the portions of boundary 302 that extend in the vertical direction. Each of the second plurality of DFBC2 204 include a second pre-defined dimensions. The second pre-defined dimensions is different than the first pre-defined dimensions. For example, the second pre-determined dimensions may have predetermined height (2y) and length (x) dimensions. The second plurality of DFBC2 204 are placed at a distance comprising half a value of the DRC value from boundary 302 (that is, y/2).

Moving to operation 540, a third plurality of the first type of dummy cells are placed along a remaining portion of the boundary. For example, additional DFBC1 202 are placed in the gaps 308A, 308B and 308C along boundary 302 not covered by the first plurality of DFBC1 202 and the second plurality of DFBC2 204. Although method 500 describes placing dummy cells in a first direction and a second direction, it will be apparent to a person with skill in the art that dummy cells may be placed in a third direction or a fourth direction. Hence, dummy cells may be placed in any direction depending on a shape of the boundary to form a ring around functional cell 102.

The use of dummy boundary cells 104 thus provides a predictable layout environment along functional cell 102 contours with repeated DFBC structures. In some implementations, the DFBC ring structure is capable of direct abutment between any types of functional cells, and the DFBC structures may be suitable a wide variety of shapes of functional cells. As noted previously, sharing DFBCs between different functional cells could reduce chip area.

The predictable environment provided by the DFBC structures helps satisfy integration process flow requirements (empty space, minimum space, forbidden zones, etc.). Uniformity at the interstices between functional blocks is improved, and allowing sharing or overlapping of DFBCs for adjacent functional blocks may provide more efficient space utilization. These "universal" or standard DFBCs may then be situated so as to surround the various functional cell boundary shapes. Providing such dummy boundary cells may simplify the integration process, allowing merging of the functional cells while meeting the various design and spacing rules.

FIG. 6 is a block diagram illustrating an example of a processing system 600 in accordance with some embodiments disclosed herein. Processing system 600 may be used to implement an EDA system in accordance with various processes discussed herein. Processing system 600 includes a processing unit 610, such as a desktop computer, a workstation, a laptop computer, a dedicated unit customized for a particular application, a smart phone or tablet, etc. Processing system 600 may be equipped with a display 614 and one or more input/output devices 612, such as a mouse, a keyboard, touchscreen, printer, etc. Processing unit 610 also includes a central processing unit (CPU) 620, memory 622, a mass storage device 624, a video adapter 626, and an I/O interface 628 connected to a bus 630.

Bus 630 may be one or more of any type of several bus architectures including a memory bus or memory controller, a peripheral bus, or video bus. CPU 620 may comprise any type of electronic data processor, and memory 622 may comprise any type of system memory, such as static random access memory (SRAM), dynamic random access memory (DRAM), or read-only memory (ROM).

Mass storage device 624 may comprise any type of storage device configured to store data, programs, and other information and to make the data, programs, and other information accessible via the bus 630. Mass storage device 624 may comprise, for example, one or more of a hard disk drive, a magnetic disk drive, an optical disk drive, flash memory, or the like.

The term computer readable media as used herein may include computer storage media such as the system memory and storage devices mentioned above. Computer storage media may include volatile and nonvolatile, removable and non-removable media implemented in any method or technology for storage of information, such as computer readable instructions, data structures, or program modules. Memory 622 and mass storage device 624 are computer storage media examples (e.g., memory storage). Mass storage device 624 may further store a library of standard cells.

Computer storage media may include RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information and which can be accessed by processing device 600. Any such computer storage media may be part of processing device 600. Computer storage media does not include a carrier wave or other propagated or modulated data signal.

Communication media may be embodied by computer readable instructions, data structures, program modules, or other data in a modulated data signal, such as a carrier wave or other transport mechanism, and includes any information delivery media. The term "modulated data signal" may describe a signal that has one or more characteristics set or changed in such a manner as to encode information in the signal. By way of example, and not limitation, communication media may include wired media such as a wired network or direct-wired connection, and wireless media such as acoustic, radio frequency (RF), infrared, and other wireless media.

Video adapter 626 and I/O interface 628 provide interfaces to couple external input and output devices to processing unit 610. As illustrated in FIG. 6, examples of input and output devices include display 614 coupled to video adapter 626 and I/O device 112, such as a mouse, keyboard, printer, and the like, coupled to I/O interface 128. Other devices may be coupled to processing unit 610, and additional or fewer interface cards may be utilized. For example, a serial interface card (not shown) may be used to provide a serial interface for a printer. Processing unit 610 also may include a network interface 640 that may be a wired link to a local area network (LAN) or a wide area network (WAN) 616 and/or a wireless link.

Embodiments of processing system 600 may include other components. For example, processing system 600 may include power supplies, cables, a motherboard, removable storage media, cases, and the like. These other components, although not shown, are considered part of processing system 600.

In some examples, software code is executed by CPU 620 to analyze a user design to create a physical integrated circuit layout. The software code may be accessed by CPU 620 via bus 630 from memory 622, mass storage device 624, or the like, or remotely through network interface 640. Further, in some examples, the physical integrated circuit layout is created based on a functional integrated circuit design, which may be received though I/O interface 628 and/or stored in memory 622 or 624 in accordance with various methods and processes implemented by the software code.

According to example embodiments, a method comprises: determining a boundary of a first functional cell of a circuit; placing a first plurality of a first type of dummy cells along a first portion of the determined boundary, wherein the first portion extends in a first direction, and wherein each of the first type of dummy cells comprises first pre-defined dimensions; and placing a second plurality of a second type of dummy cells along a second portion of the determined boundary, wherein the second portion extends in a second direction, wherein each of the second type of dummy cells comprises second pre-defined dimensions, and wherein the second pre-defined dimensions is different than the first pre-defined dimensions.

In example embodiments, the first type of dummy cells and the second type of dummy cells do not contain functional circuits. The first type of dummy cells are based on a first standard dummy friendly boundary cell and the second type of dummy cells are based on a second standard dummy friendly boundary cell. The first type of dummy cells and the second type of dummy cells undergo vertical expansion by multiplying heights of the first standard dummy friendly boundary cell and the second standard dummy friendly boundary cell respectively.

According to embodiments, the method further comprises placing a third plurality of the first type of dummy cells along a remaining portion of the boundary. Placing the third plurality of the first type of dummy cells in the remaining portion of the boundary comprises placing the third plurality of the first type of dummy cells in gaps along the boundary not covered by the first plurality of the first type of dummy cells and the second plurality of the second type of dummy cells. The second direction is orthogonal to the first direction.

In example embodiments, the method further comprises: determining another boundary of a second functional cell of the circuit, the second functional cell abutting the first cell; and placing a third plurality of the first type of dummy cells along a first portion of the another boundary of the second functional cell, wherein at least a portion of the first type of dummy cells are common in the first plurality of the first type of dummy cells and the third plurality of the first type of dummy cells.

According to example embodiments, the method further comprises: determining another boundary of a second functional cell of the circuit, the second cell functional abutting the first cell; and placing a fourth plurality of the second type of dummy cells along a second portion of the another boundary of the second functional cell, wherein at least a portion of the second type of dummy cells are common in the second plurality of the second type of dummy cells and the fourth plurality of the second type of dummy cells.

In example embodiments, a circuit comprises: a first functional cell; a first plurality of dummy cells placed along portions of a boundary extending in a first direction around the first functional cell, the first plurality of dummy cells placed abutting one another; a second plurality of dummy cells placed along a second portion of the boundary extending in a second direction around the first functional cell, the second plurality of dummy cells placed abutting one another; and one or more dummy cells placed along in one or more remaining portions of the boundary forming a ring of dummy cells around the first functional cell.

According to example embodiments, an apparatus comprises: a memory device; and a processor connected to the memory device, wherein the processor is operative to: determine a first boundary around a first cell of a circuit; place a first plurality of a first type of dummy cells in a first portion of the first boundary in a first direction, wherein each of the first type of dummy cells comprises a first pre-defined dimension; place a second plurality of a second type of dummy cells in a second portion of the first boundary in a second direction, wherein each of the second type of dummy cells comprises a second pre-defined dimension, wherein the second pre-defined dimension is different than the first pre-defined dimension, and wherein the second direction is different than the first direction; and place a third plurality of the first type of dummy cells in a remaining portion of the first boundary.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   determining a boundary of a first functional cell;
   placing a first plurality of a first type of dummy cells along a first portion of the determined boundary, wherein the first portion extends in a first direction, and wherein each of the first type of dummy cells comprises first pre-defined dimensions; and
   placing a second plurality of a second type of dummy cells along a second portion of the determined boundary, the second portion of the boundary extending in a second direction, wherein each of the second type of dummy cells comprises second pre-defined dimensions, and wherein the second pre-defined dimensions are different than the first pre-defined dimensions; and
   placing a third plurality of the first type of dummy cells along a remaining portion of the boundary, wherein placing the third plurality of the first type of dummy cells along the remaining portion of the boundary comprises placing the third plurality of the first type of dummy cells in gaps along the boundary not covered by the first plurality of the first type of dummy cells and the second plurality of the second type of dummy cells forming a ring of dummy cells around the first functional cell, and wherein the first type of dummy cells and the second type of dummy cells are placed at a predetermined distance inside the determined boundary.

2. The method of claim 1, wherein the first type of dummy cells are based on a first standard dummy friendly boundary cell and the second type of dummy cells are based on a second standard dummy friendly boundary cell.

3. The method of claim 2, wherein the first type of dummy cells and the second type of dummy cells undergo vertical expansion by multiplying heights of the first standard dummy friendly boundary cell and the second standard dummy friendly boundary cell respectively.

4. The method of claim 1, wherein the second direction is orthogonal to the first direction.

5. The method of claim 1, further comprising:
   determining another boundary of a second functional cell of the circuit, the second functional cell abutting the first functional cells; and
   placing the third plurality of the first type of dummy cells along a first portion of the another boundary of the second functional cell, wherein at least a portion of the first type of dummy cells are common in the first plurality of the first type of dummy cells and the third plurality of the first type of dummy cells.

6. The method of claim 1, further comprising:
   determining another boundary of a second functional cell of the circuit, the second cell functional abutting the first cell; and
   placing a fourth plurality of the second type of dummy cells along a second portion of the another boundary of the second functional cell, wherein at least a portion of the second type of dummy cells are common in the second plurality of the second type of dummy cells and the fourth plurality of the second type of dummy cells.

7. A circuit comprising:
   a first functional cell;
   a first plurality of dummy cells placed along portions of a boundary extending in a first direction around the first functional cell, the first plurality of dummy cells placed abutting one another;
   a second plurality of dummy cells placed along a second portion of the boundary extending in a second direction around the first functional cell, the second plurality of dummy cells placed abutting one another; and
   one or more dummy cells placed along in one or more remaining portions of the boundary not covered by the first plurality of the first type of dummy cells and the second plurality of the second type of dummy cells forming a ring of dummy cells around the first functional cell, wherein the first type of dummy cells and the second type of dummy cells are placed at a predetermined distance inside the determined boundary.

8. The circuit of claim 7, wherein the ring of dummy cells is placed at a distance comprising a half value of a design rule check value from the boundary.

9. The circuit of claim 7, wherein the boundary is a place and route boundary.

10. The circuit of claim 7, wherein the first plurality of dummy cells comprises a first type of dummy cells having first pre-defined dimensions, and wherein the second plurality of dummy cells comprises a second type of dummy cells having second pre-defined dimensions, and wherein the second pre-defined dimensions are different than the first pre-defined dimensions.

11. The circuit of claim 10, wherein a height of each of the second type of dummy cells is approximately twice the height of each of the first type of dummy cells.

12. The circuit of claim 7, wherein at least a portion of the dummy cells is shared with the boundary of a second cell of the circuit.

13. The method of claim 1, wherein dummy cells undergo vertical expansion by multiplying heights of the dummy cells.

14. An apparatus comprising:
    a memory device; and
    a processor connected to the memory device, wherein the processor is operative to:
       determine a first boundary around a first cell of a circuit;
       place a first plurality of a first type of dummy cells along a first portion of the first boundary in a first direction, wherein each of the first type of dummy cells comprises a first pre-defined dimension;
       place a second plurality of a second type of dummy cells along a second portion of the first boundary in a second direction, wherein each of the second type of dummy cells comprises a second pre-defined dimension, wherein the second pre-defined dimension is different than the first pre-defined dimension, and wherein the second direction is different than the first direction; and
       place a third plurality of the first type of dummy cells along a remaining portion of the first boundary not covered by the first plurality of the first type of dummy cells and the second plurality of the second type of dummy cells forming a ring of dummy cells around the first functional cell, wherein the first type of dummy cells and the second type of dummy cells are placed inside at a predetermined distance from the first boundary.

15. The apparatus of claim 14, wherein the processor is further operative to:
    determine a second boundary around a second cell of the circuit, wherein the first boundary and the second boundary share a common portion; and
    place multiplicity of the first type of dummy cells and the second type of dummy cells along the second boundary shared the common portion.

16. The apparatus of claim 14, wherein a height of each of the second type of dummy cells is approximately twice the height of each of the first type of dummy cells.

17. The apparatus of claim 14, wherein at least a portion of the dummy cells is shared with the boundary of a second cell of the circuit.

18. The apparatus of claim 14, wherein the first plurality of dummy cells comprises a first type of dummy cells having first pre-defined dimensions, and wherein the second plurality of dummy cells comprises a second type of dummy cells having second pre-defined dimensions, and wherein the second pre-defined dimensions are different than the first pre-defined dimensions.

* * * * *